United States Patent
Levin et al.

(10) Patent No.: US 7,368,760 B2
(45) Date of Patent: May 6, 2008

(54) LOW PARASITIC CAPACITANCE SCHOTTKY DIODE

(75) Inventors: Sharon Levin, Haifa (IL); Shye Shapira, Haifa (IL); Ira Noat, Zikhron Yaakov (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 328 days.

(21) Appl. No.: 11/135,846

(22) Filed: May 23, 2005

(65) Prior Publication Data

US 2006/0125039 A1 Jun. 15, 2006

Related U.S. Application Data

(60) Provisional application No. 60/636,568, filed on Dec. 15, 2004.

(51) Int. Cl.
*H01L 29/74* (2006.01)
*H01L 31/111* (2006.01)

(52) U.S. Cl. ............... 257/109; 257/155; 257/E21.351

(58) Field of Classification Search ........ 257/449–486, 257/109, 155, E21.351
See application file for complete search history.

(56) References Cited

U.S. PATENT DOCUMENTS

| | | | |
|---|---|---|---|
| 3,956,527 A | 5/1976 | Magdo et al. | |
| 4,628,339 A | * 12/1986 | Vora et al. | ............. 257/456 |
| 4,772,931 A | 9/1988 | Rogers | |
| 5,130,268 A | 7/1992 | Liou et al. | |
| 5,347,161 A | 9/1994 | Wu et al. | |
| 6,608,362 B1 | 8/2003 | Kai et al. | |
| 6,825,073 B1 | 11/2004 | Wu | |

* cited by examiner

*Primary Examiner*—Cuong Nguyen
(74) *Attorney, Agent, or Firm*—Bever, Hoffman & Harms, LLP; Patrick T. Bever

(57) ABSTRACT

A low parasitic capacitance Schottky diode including a lightly doped polycrystalline silicon island that is formed on a shallow trench isolation (STI) pad such that the polycrystalline silicon island is entirely isolated from an underlying silicon substrate by the STI pad. The resulting structure reduces leakage and capacitive coupling to the substrate. Silicide contact structures are attached to lightly-doped and heavily-doped regions of the polycrystalline silicon island to form the Schottky junction and Ohmic contact, respectively, and are connected by metal structures to other components formed on the silicon substrate. The STI pad, polycrystalline silicon island, and silicide/metal contacts are formed using a standard CMOS process flow to minimize cost. A bolometer detector is provided by measuring current through the diode in reverse bias. An array of such detectors comprises an infrared or optical image sensor.

15 Claims, 5 Drawing Sheets

US 7,368,760 B2

LOW PARASITIC CAPACITANCE SCHOTTKY DIODE

RELATED APPLICATIONS

This application claims priority of U.S. Provisional Patent Application 60/636,568, entitled "Sensing Concept Using An Integrator" filed Dec. 15, 2004.

FIELD OF THE INVENTION

This invention relates to integrated circuits, and more particularly to Schottky diodes formed on integrated circuits.

BACKGROUND OF THE INVENTION

Certain integrated circuits (ICs), such those produced to perform radio frequency (RF) and mixed signal (MS) functions, utilize passive components such as diodes, inductors, and capacitors to generate or modify the necessary high frequency signals. These passive components require a high quality factor, but their quality factor is often reduced by capacitive coupling to a resistive substrate. For example, the capacitive and inductive coupling of an inductor to the resistive substrate will reduce the quality factor of an inductor. Also, the substrate may contain noisy currents generated by digital circuits. Via the coupling to the substrate this noise may be injected to the RF or analog circuit through the passive component, thus degrading the circuits performance.

Schottky diodes are utilized in RF and MS ICs, for example, to produce voltage multipliers and RF mixers. However, the operation of Schottky diodes that are made using conventional methods suffers from parasitic capacitance and leakage to the underlying substrate. Such a leakage path can bypass the diode, degrading the diode's rectifying or nonlinear behavior.

What is needed is a method for fabricating Schottky diodes for RF and MS circuits whereby the parasitic capacitance and leakage to the underlying substrate is substantially reduced. What is also needed is a method for producing such Schottky diodes in a standard CMOS processing flow and in a manner that reduces the number of additional processing steps, thus maintaining the lowest production cost possible for such a diode and the circuits incorporating the diode.

SUMMARY OF THE INVENTION

The present invention is directed to a Schottky diode including metal/silicide contacts to a doped polycrystalline silicon ("polysilicon") island that is formed on a shallow trench isolation (STI) pad, which in turn is formed in a semiconductor (e.g., silicon) substrate. The polysilicon island includes a lightly-doped region and a heavily-doped region that is formed in the lightly-doped region. A first metal/silicide contact formed on the lightly-doped region provides the Schottky junction, and a second metal/silicide contact formed on the heavily-doped region provides the Ohmic contact of the Schottky diode. Parasitic capacitance and leakage from the polysilicon island to the underlying semiconductor substrate is greatly reduced by entirely isolating the polysilicon island from the semiconductor substrate using the STI pad. A third (ground) contact to the polysilicon island and/or an n-well formed under the STI pad further serves to reduce noise. The Schotkky on STI pad benefits from better thermal isolation as compared to "bulk" diodes, and hence can be used as a bolometer detector for optical and infrared radiation: the radiation impinging on the diode raises it temperature and the temperature change is detected by the diode in reverse bias which serves as a sensitive temperature dependent resistor. Thermal isolation may be further enhanced by selectively etching the STI, thus leaving the diode suspended. An array of such "pixel" devices may then be incorporated into an infrared or optical image sensor.

According to another embodiment, an IC device is formed on semiconductor substrate using a standard CMOS production flow that includes both the Schottky diode of the present invention and at least one field effect transistor (FET). Another benefit of the present invention is that the Schottky diode is produced using little or no added expense—i.e., the Schottky diode is essentially "free" in the sense that it is formed using the same CMOS processing steps (or very few additional steps) as those used to form the FET. In particular, the STI (isolation) pad is formed simultaneously with an isolation structure of the FET, the polysilicon island is formed simultaneously with a polysilicon gate of the FET, the doped regions of the polysilicon island are formed simultaneously with the source/drain regions of the FET, and the metal/silicide contacts of the Schottky diode are formed simultaneously with metal/silicide contacts to the FET.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1A:
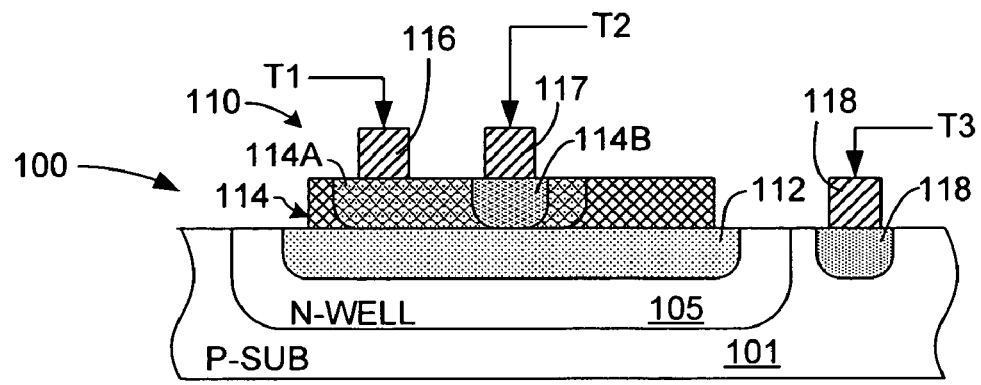
FIGS. 1(A) and 1(B) are cross-sectional side and top plan views showing a simplified Schottky diode according to an embodiment of the present invention.
Figure 1B:
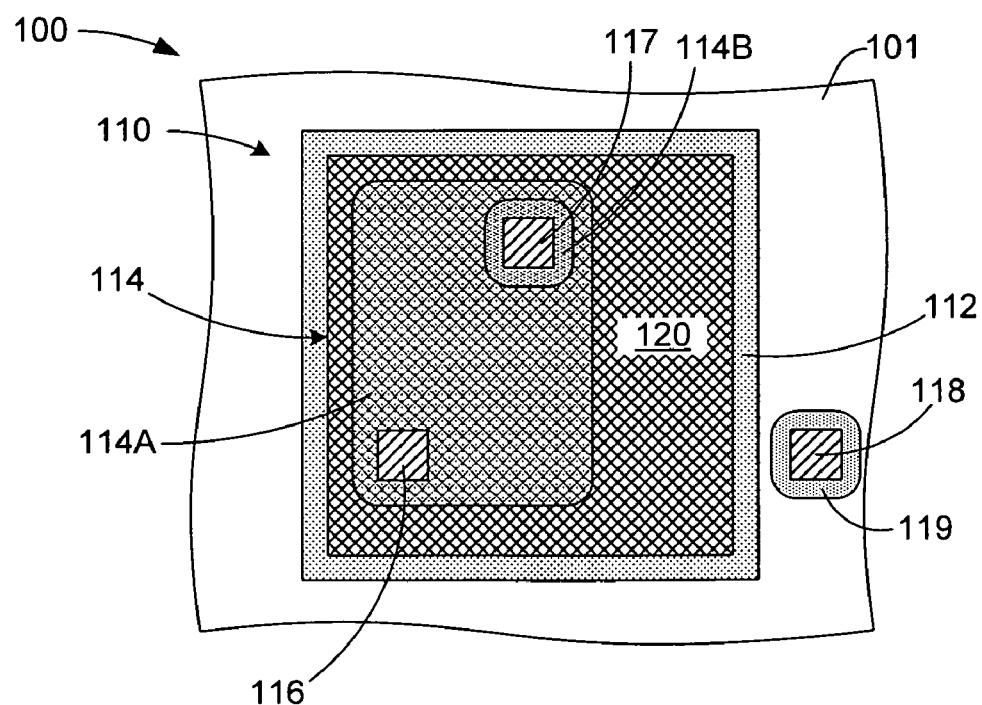

FIGS. 1(A) and 1(B) are cross-section side and top views, respectively, showing a Schottky diode 110 formed on a semiconductor substrate 101 according to an embodiment of the present invention.

As used herein, the term "semiconductor substrate" is used to describe a substrate structure that can be modified by known lithographic processing techniques to produce an integrated circuit. In an exemplary embodiment, semiconductor substrate 101 is a silicon substrate, and the process utilized to produce Schottky diode 110 is a standard CMOS process flow.

Referring to FIGS. 1(A) and 1(B), Schottky diode 110 generally includes an isolation pad 112 formed on an upper surface of semiconductor substrate 101, a polycrystalline silicon ("polysilicon") island 114 formed on isolation pad 112, and contact structures 116 and 117 that are formed on polysilicon island 114 to provide the anode/cathode terminals of Schottky diode 110.

In accordance with an embodiment of the present invention, isolation pad 112 is implemented using a shallow trench isolation (STI) structure that is fabricated by known lithographic fabrication techniques, and includes an electrically insulating material (e.g., silicon-oxide) that entirely covers a predetermined region of substrate 101, as indicated in FIG. 1(B). As described below, the purpose of isolation pad 112 is to facilitate electrical isolation of polysilicon island 114 from substrate 101, thereby reducing the parasitic capacitance of Schottky diode 110 in comparison to conventional constructions. The benefits of using a STI structure for this purpose is that STI structures provide a planarized upper surface that facilitates the formation of flat (planar) polysilicon island 114 thereon, and because STI formation is included in many standard CMOS fabrication process flows, thereby reducing manufacturing costs by allowing the STI isolation pad to be formed at the same time STI structures are formed for other purposes (e.g., to define active regions of substrate 101). In an alternative embodiment, other isolation pad materials and fabrication techniques may be used, such as LOCOS and Poly Buffered LOCOS.

In accordance with an aspect of the present invention, polysilicon island 114 is entirely formed on STI pad 112 (i.e., such that polysilicon island 114 only contacts STI pad 112, and is entirely isolated from semiconductor substrate 101 by the STI pad 112). As mentioned above, polysilicon island 114 is electrically isolated from substrate 101 by isolation pad 112, thereby reducing the parasitic capacitance and leakage of Schottky diode 110 in comparison to conventional constructions. As described below, polysilicon island 114 forms the body of Schottky diode 110, and as such includes a lightly-doped region 114A, and a heavily doped region 114B that contacts the lightly-doped region, both being doped with a common (e.g., n-type or p-type) dopant. The term "contacts" in this context is used herein to indicate that the relatively high doping concentration region associated with heavily doped region 114B intersects the relatively low doping concentration region associated with lightly doped region 114A. The benefits of using polycrystalline silicon to form polysilicon island 114 are that polysilicon formation is included in many standard CMOS fabrication process flows, thereby reducing manufacturing costs by allowing the polysilicon islands to be formed at the same time polysilicon structures are formed for other purposes (e.g., as gate structures in CMOS field effect transistors).

A first contact structure 116 is formed on polycrystalline silicon island 114 such that it contacts lightly-doped region 114A, and a second contact structure 117 is formed on polycrystalline silicon island 114 such that it contacts heavily-doped region 114B. In one embodiment, first contact structure 116 and second contact structure 117 are implemented using a silicide metal (e.g., Co, Ti, Ni or Pt) that is thermally activated according to known techniques to form metal-silicide structures. Similar to the STI pad and polysilicon island, a benefit of using silicide contact structures is that the formation of such structures is typically included in a standard CMOS flow. The junction of first contact 116 and lightly-doped region 114A forms the Schottky junction, and the junction of second contact 117 and heavily-doped region 114B serves as the silicon-side Ohmic contact. First contact 116 is connected by way of metal structures to a signal source T1 (indicated by arrow), and second contact 117 is operably connected to a signal destination T2 (indicated by arrow). In operation, a signal received from source T1 and applied to first contact 116 passed through the doped regions of polysilicon island 114 to second contact 117, thereby generating a resulting signal at signal destination T2. Note that, in one embodiment, first contact 116 is surrounded by second contact 117 to reduce series resistance.

An optional third contact 118 to substrate 101 is formed by way of a heavily-doped p-type diffusion 119 in the manner described above, and is connected to a third signal source T3 (e.g., ground (bulk)) that serves to remove noise signals that can couple Schottky diode 110 to substrate 101 during operation. In an alternative embodiment, third contact 118 is connected to a heavily doped region in an optional n-well region 105 formed under and around the isolation pad 112 such that isolation pad 112 (and, hence, polysilicon island 114) are entirely separated from the underlying p-doped substrate 101. In this case, n-well region 105 acts as the "third" contact of Schottky diode 110 to remove noise signals coupling capacitively from substrate 101.

Figure 2:
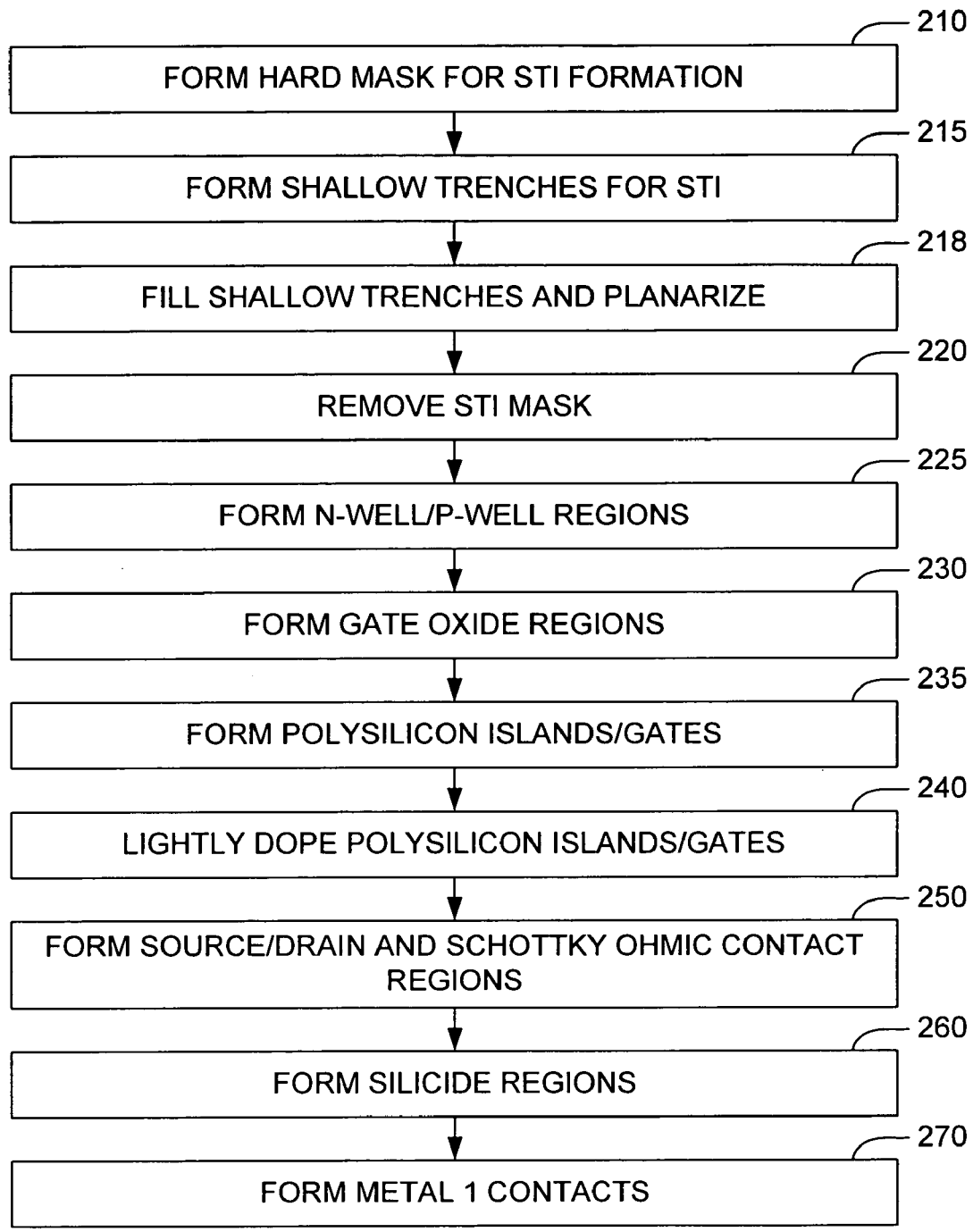
FIG. 2 is a flow diagram showing a method for producing an IC including the Schottky diode of FIGS. 1(A) and 1(B) in accordance with a second embodiment of the present invention.

FIG. 2 is a flow diagram illustrating a simplified method for fabricating integrated circuits including the Schottky diode described above and a field effect transistor (FET) in accordance with another embodiment of the present invention. FIGS. 3(A) through 3(G) are cross-sectional side views illustrating exemplary stages of the fabrication process. Note that the FET described in association with this embodiment is exemplary, and provided mainly to depict how the Schottky diode of the present invention is formed using structures that are provided in, for example, a standard CMOS process flow, thereby allowing facilitating the production of low parasitic capacitance Schottky diodes in a highly cost-efficient manner.

Figure 3A:
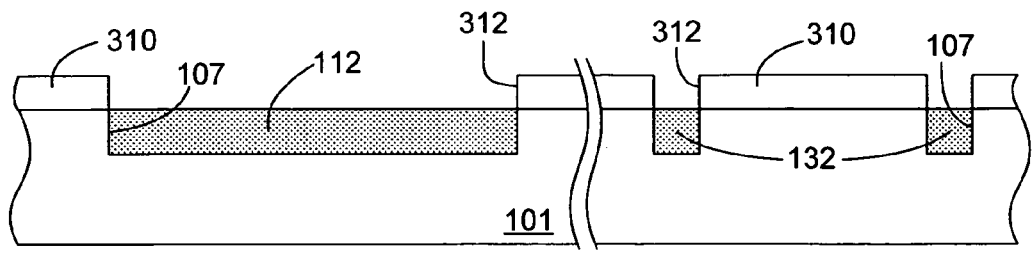
FIGS. 3(A), 3(B), 3(C), 3(D), 3(E), 3(F), and 3(G) are cross-sectional side views showing an IC during selected stages of fabrication according to the method shown in FIG. 2.
Figure 3B:
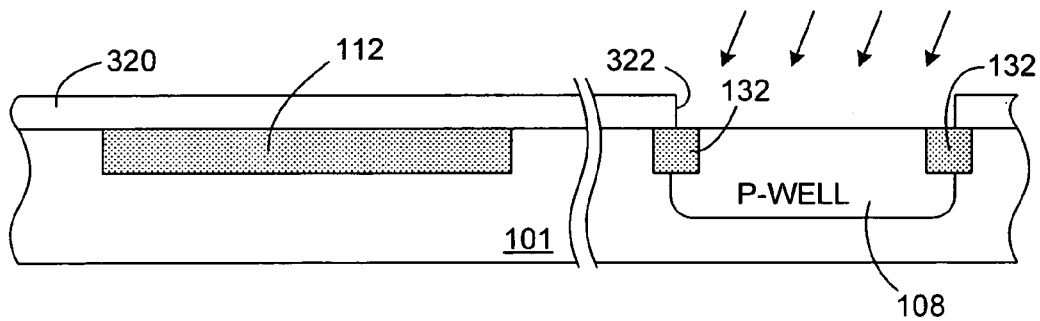

Referring to the top of FIG. 2 and FIGS. 3(A) and 3(B), the process begins by simultaneously forming the STI (isolation) pad of the Schottky diode and a STI (isolation) region surrounding an active region in which the FET is formed. First, a hard mask 310 is formed and openings 312 are patterned for STI oxide formation (block 210). In one embodiment, hard mask 310 (FIG. 3(A)) includes a thermal oxide bottom layer and a chemical vapor deposition (CVD) silicon nitride layer. Next, shallow trenches are formed in the semiconductor substrate through the openings formed in the hard mask (block 215; FIG. 2). In one embodiment, the formation of shallow-trenches 107 includes a silicon trench etch, a corner-rounding silicon etch, and thermal oxidation for forming trench-liner-oxide. Note that shallow-trenches 107 are formed for both the formation of STI pad 112 and isolation structures 132. Next, the shallow trenches are filled and planarized (block 218). Referring to FIG. 3(A), in one embodiment, STI pad 112 and isolation regions 132 are formed by filling shallow trenches 107 with silicon-oxide using CVD, and then planarizing by chemical-mechanical polishing (CMP). In one specific embodiment, STI pad 112 is formed to depth (thickness) of 3500 angstroms, and oxide may be grown an extra 300 angstroms above the surface of semiconductor substrate 101. Next, the STI hard mask is removed (block 220), and n-well and p-well regions are formed in semiconductor substrate 101 using known techniques (block 225). Referring to FIG. 3(B), in one embodiment, the formation of active region (P-Well) 108 is implemented by masking unrelated areas (e.g., using mask 320 that is patterned to include openings 322), and doping the related areas using a combination of ion implantation and thermal diffusion processes. Note that a second mask would be used to form optional N-well 105 (FIG. 1(A)).

Figure 3C:
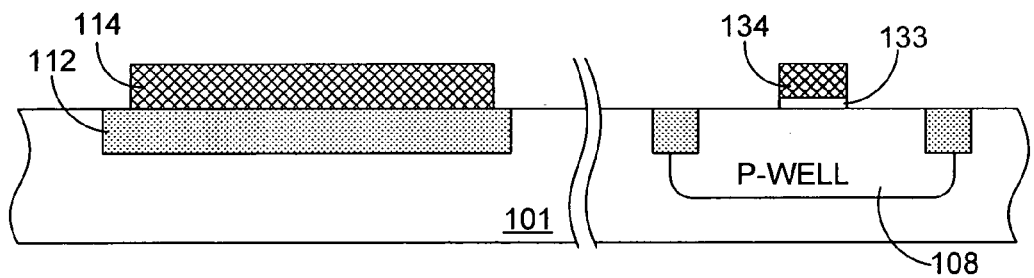

Next, referring to FIG. 3(C), polysilicon island 114 of the Schottky diode and a polysilicon gate structure 134 of the FET are simultaneously formed on STI pad 112 and semiconductor substrate 101. First, one or more gate oxide layers are grown and/or patterned to form gate oxide regions (block 230), and then the polysilicon islands/gates are formed over the gate oxide (block 235). As indicated in FIG. 3(C), in one embodiment, gate oxide region 133 is formed by thermal oxidation of exposed substrate surfaces (no oxide will form on exposed STI structures). Next, a polysilicon layer is deposited and patterned using known techniques to form polysilicon island 114 such that polysilicon island 114 is entirely isolated from substrate 101 by STI pad 112, and to form polysilicon gate 134 such that polysilicon gate 134 is formed on gate oxide region 133 and positioned over active (P-well) region 108 and between STI structures 132. In an exemplary embodiment, polysilicon island 114 has a thickness of 2000 angstroms.

Figure 3D:
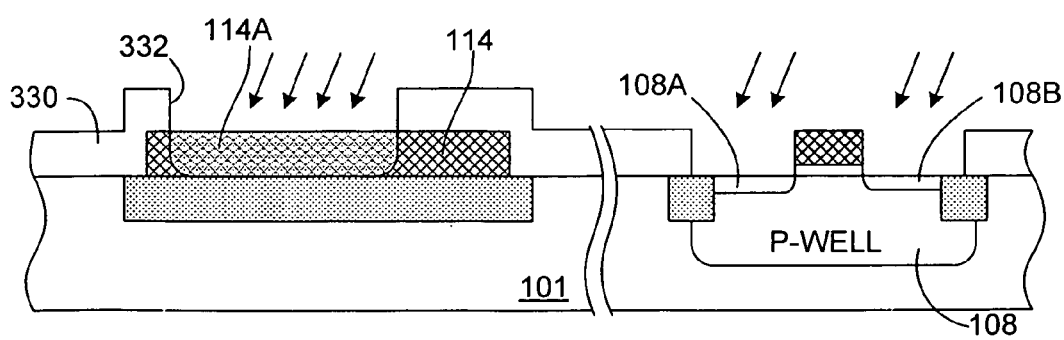
Figure 3E:
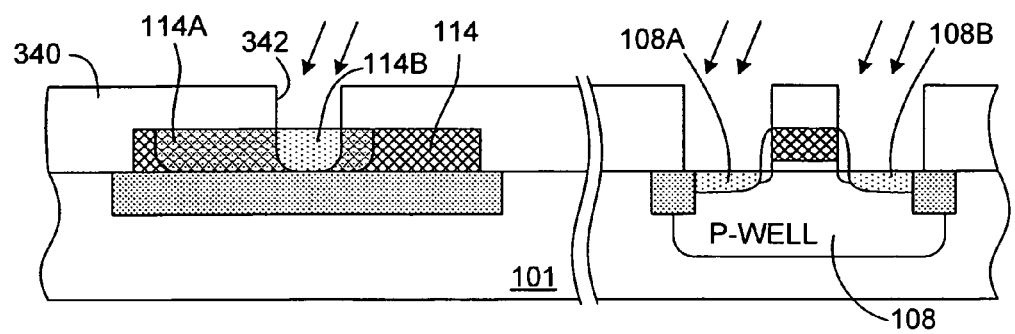

Next, as indicated in FIGS. 3(D) and 3(E), polysilicon island 114, polysilicon gate structure 134, and active region 108 are simultaneously doped such that polysilicon island 114 includes lightly-doped region 114A and a heavily-doped region 114B, and active region 108 includes a source region 108A and a drain region 108B located on opposite sides of polysilicon gate 134. In one embodiment, an initial light-doping process is performed by blanket implant of the whole wafer. The initial implant can be performed in a blanket manner (i.e., without a corresponding mask) because all consecutive implants have higher doses and totally "erase" the effects of the relatively light blanket implant. Alternatively, an extra mask 330 may be used that is patterned with openings 332 to form lightly-doped region 114A (FIG. 3(D); see also block 240, FIG. 2). In one embodiment, this light doping process is performed by ion implantation using one or more of boron, arsenic, and phosphorus. Then, another mask 340 is formed and patterned with openings 342 to facilitate a heavy-doping process performed according to high-dose ion implantation techniques to form heavily-doped region 114B and heavily-doped portions of source region 108A and drain region 108B (FIG. 3(E); see also block 250, FIG. 2).

Figure 3F:
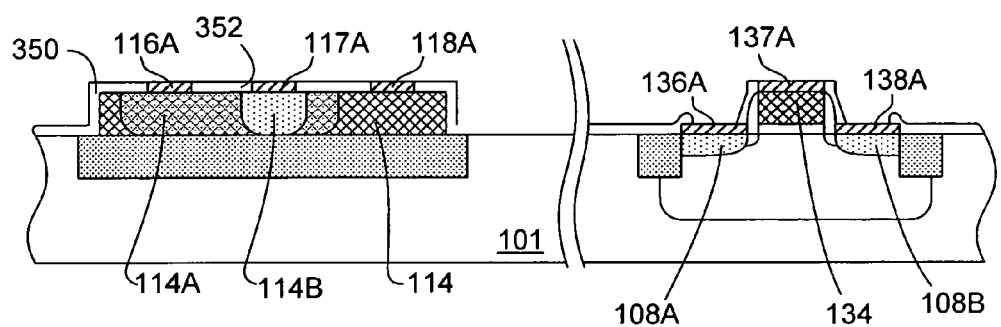
Figure 3G:
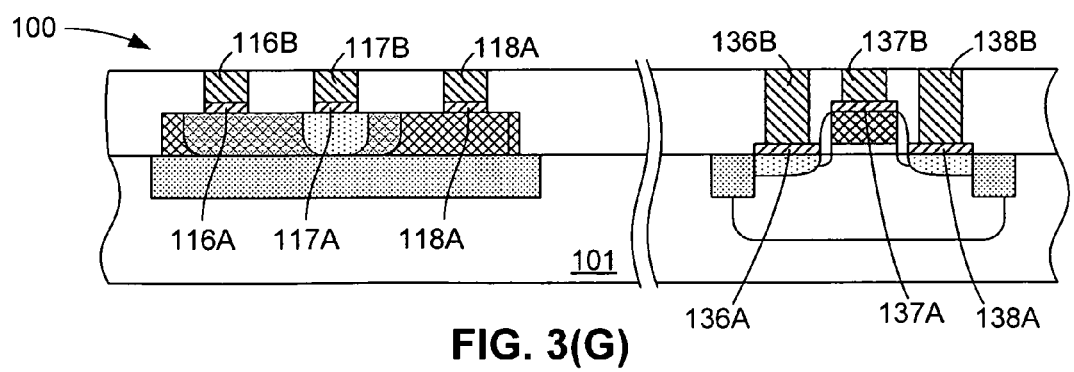

Next, as indicated in FIGS. 3(F) and 3(G), contact structures are formed on lightly-doped region 114A and heavily-doped region 114B of polysilicon island 114, polysilicon gate structure 134, source region 108A and drain region 108B are simultaneously formed. First, silicide regions are formed on these structures (block 260), and then metal contact structures are formed on the silicide regions (block 270). As indicated in FIG. 3(F), a silicide hard mask 350 (e.g., silicon oxide or nitride) is deposited and patterned with openings 352, and silicide metal (e.g., Ti, Co, Ni, or Pt) are deposited and thermally activated to form metal-silicide structures 116A, 117A and 118A on polysilicon island 114, and metal-silicide structures 136A, 137A and 138A on source region 108A, polysilicon gate 134 and drain region 108B. Un-reacted metal is then removed by chemical etch. Finally, during the METAL 1 phase of the selected CMOS process flow, metal contacts 116B, 117B and 118B are formed on silicide structures 116A, 117A and 118A, respectively, and metal contacts 136B, 137B and 138B are formed on silicide structures 136A, 137A and 138A, thus completing IC 100.

Although the present invention has been described above with reference to diodes fabricated next to NMOS transistors in P-type wells, thus assuming the diode is formed with a contact to lightly doped p-type silicon (e.g., a P-well), in another embodiment the diode may be produced with silicide contacts to lightly doped n-type silicon (e.g., an N-well).

Figure 4:
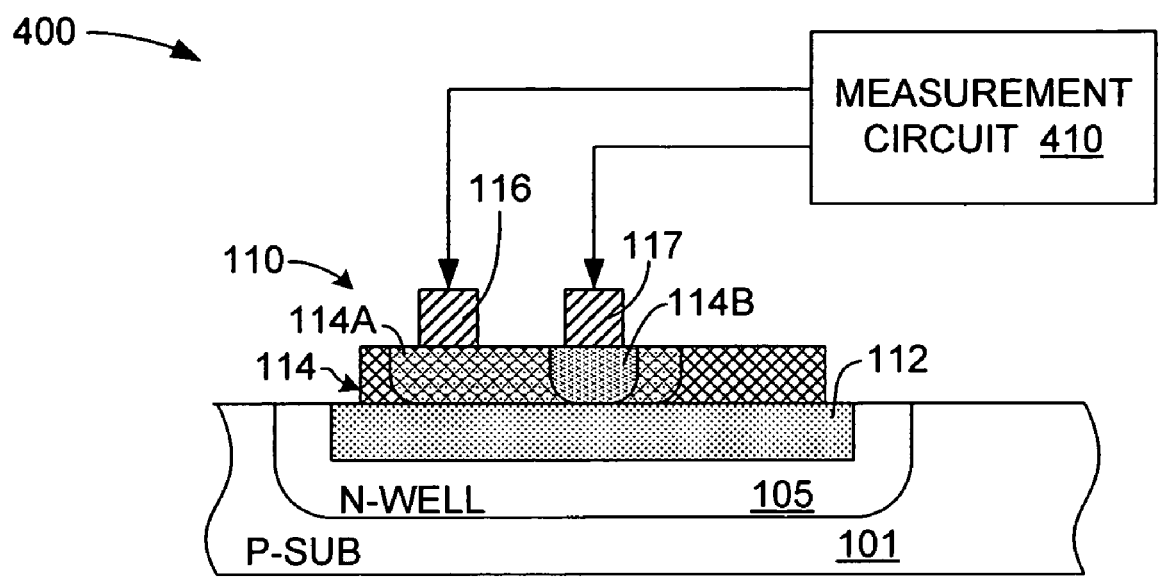
FIG. 4 is a cross-sectional side view showing a bolometer detector circuit utilizing the Schottky diode of FIG. 1 according to another embodiment of the present invention.

In accordance with another aspect of the present invention shown in FIG. 4, an IC 400 includes a measurement circuit 410 coupled to contacts 116 and 117 for measuring a current through diode 110 in reverse bias, thus enabling the use of diode 110 as a bolometer detector for optical and infrared radiation, where diode 110 serves as a sensitive temperature dependent resistor. By forming diode 110 on STI, diode 110 exhibits enhanced thermal isolation as compared to "bulk" diodes, and hence enables its use as a bolometer. Thermal isolation may be further enhanced by selectively etching the STI, thus leaving diode 110 suspended. The bolometer may then be used as a unit in a pixel array comprising and optical or infrared image sensor.

Although the present invention has been described with respect to certain specific embodiments, it will be clear to those skilled in the art that the inventive features of the present invention are applicable to other embodiments as well, all of which are intended to fall within the scope of the present invention. For example, the diode may be incorporated into a radio frequency identification (RFID) circuit.

The invention claimed is:

1. An integrated circuit formed on a semiconductor substrate, the integrated circuit comprising:
    a shallow trench isolation (STI) pad formed on a surface of the semiconductor substrate; and
    a Schottky diode including:
        a polycrystalline silicon island formed on the STI pad such that the polycrystalline silicon island directly contacts the STI pad and is entirely isolated from the semiconductor substrate by the STI pad; and
        a plurality of contact structures connected to the polycrystalline silicon island.

2. The integrated circuit according to claim 1,
    wherein the polycrystalline silicon island comprises a lightly-doped region and a heavily doped region communicating with the lightly-doped region, and
    wherein the plurality of contacts comprises a first contact structure formed on the lightly-doped region, and a second contact formed on the heavily-doped region.

3. The integrated circuit according to claim 2, wherein each of the first and second contact structures comprises a silicide structure formed on an upper surface of the polycrystalline silicon island.

4. The integrated circuit according to claim 2, wherein at least one of the first and second contact structures comprises a metal structure formed on an upper surface of the polycrystalline silicon island.

5. The integrated circuit according to claim 2, further comprising a third contact structure formed on the substrate, and means connected to the third contact structure for controlling a voltage level on the third contact structure.

6. The integrated circuit according to claim 1,
    wherein the semiconductor substrate includes a first doped region comprising a first dopant having a first conductivity type, and a well region extending into the semiconductor substrate and located such that the isolation pad is entirely separated from the first doped region by the second well region, wherein the second well region comprises a second dopant having a second conductivity type, and
    wherein the STI pad is located in the doped well region such that the STI pad is entirely separated from the first doped region of the semiconductor substrate by the doped well region.

7. An integrated circuit comprising:
    a semiconductor substrate;
    an isolation pad comprising an electrically insulating material formed on a surface of the semiconductor substrate; and a diode including:
  a polycrystalline silicon island formed over a surface of isolation pad such that the polycrystalline silicon island is entirely isolated from the semiconductor substrate by the isolation pad, wherein the polycrystalline silicon island has an upper surface and includes a lightly-doped region extending from the upper surface into the polycrystalline silicon island and a heavily-doped region extending from the upper surface into the polycrystalline silicon island and formed in the lightly-doped region such that a peripheral edge of the heavily-doped region is surrounded by the lightly-doped region; and
  a plurality of contact structures including a first contact structure connected to the lightly-doped region, and a second contact structure connected to the heavily-doped region.

8. The integrated circuit according to claim 7, wherein the isolation pad comprises a shallow trench isolation (STI) structure formed on a surface of the semiconductor substrate.

9. The integrated circuit according to claim 7, wherein each of the first and second contact structures comprises a silicide structure formed on the upper surface of the polycrystalline silicon island.

10. The integrated circuit according to claim 7, wherein each of the first and second contact structures comprises a metal structure formed on the upper surface of the polycrystalline silicon island.

11. The integrated circuit according to claim 7, further comprising a third contact structure formed on the upper surface of the polycrystalline silicon island, and means connected to the third contact structure for controlling a voltage level on the third contact structure.

12. The integrated circuit according to claim 7,
  wherein the semiconductor substrate includes a first doped region comprising a first dopant having a first conductivity type, and a well region extending into the semiconductor substrate and located such that the isolation pad is entirely separated from the first doped region by the second well region, wherein the second well region comprises a second dopant having a second conductivity type, and
  wherein the isolation pad is located in the doped well region such that the isolation pad is entirely separated from the first doped region of the semiconductor substrate by the doped well region.

13. The integrated circuit according to claim 7, further comprising means for measuring a current through the diode in reverse bias, thus enabling the use of the diode as a bolometer detector for optical and infrared radiation.

14. The integrated circuit according to claim 13, comprising an array serving as one of an optical image sensor and an infrared image sensor including said bolometer detector.

15. The integrated circuit according to claim 7, wherein the integrated circuit comprises a radio frequency identification (RFID) circuit.

* * * * *